(12) United States Patent
Saisho

(10) Patent No.: US 12,288,714 B2
(45) Date of Patent: Apr. 29, 2025

(54) SAMPLE HOLDER

(71) Applicant: KYOCERA Corporation, Kyoto (JP)

(72) Inventor: Seiya Saisho, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 670 days.

(21) Appl. No.: 17/252,012

(22) PCT Filed: Jun. 24, 2019

(86) PCT No.: PCT/JP2019/024920
§ 371 (c)(1),
(2) Date: Dec. 14, 2020

(87) PCT Pub. No.: WO2020/004309
PCT Pub. Date: Jan. 2, 2020

(65) Prior Publication Data
US 2021/0265190 A1    Aug. 26, 2021

(30) Foreign Application Priority Data

Jun. 26, 2018 (JP) .................. 2018-120971

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67092* (2013.01); *H01L 21/67103* (2013.01); *H01L 21/68757* (2013.01); *H01L 21/68785* (2013.01)

(58) Field of Classification Search
None
See application file for complete search history.

(56) References Cited

U.S. PATENT DOCUMENTS

2009/0277895 A1* 11/2009 Komatsu ............. C23C 16/4586
108/50.02
2012/0287552 A1* 11/2012 Shiraiwa ........... H01L 21/67109
361/234

(Continued)

FOREIGN PATENT DOCUMENTS

| JP | 2016-103560 A | 6/2016 | |
| WO | WO-2017188189 A1 * | 11/2017 | ....... H01L 21/67103 |
| WO | WO-2018123729 A1 * | 7/2018 | ....... H01L 21/67103 |

OTHER PUBLICATIONS

Certified Foreign Priority Application, from WIPO. Application No. 2016-250752 from Japan, made avaialbe on Dec. 27, 2016 via WIPO Digital Access Service. Sourced from U.S. Appl. No. 16/470,598. Printed on Apr. 19, 2023. (Year: 2016).*

(Continued)

*Primary Examiner* — Parviz Hassanzadeh
*Assistant Examiner* — Tiffany Z Nuckols
(74) *Attorney, Agent, or Firm* — Volpe Koenig

(57) ABSTRACT

A sample holder according to the disclosure includes: for example, a plate-like ceramic substrate; a heat-generating resistor; a metallic member configured to cover another principal surface of the ceramic substrate; a bonding layer configured to bond the ceramic substrate and the metallic member; a lead terminal; a conduction section which is disposed inside the bonding layer and is configured to electrically connect the heat-generating resistor and the lead terminal; and a joining member configured to join the conduction section and the lead terminal. The joining member is covered with a low-thermal-conductivity member which is lower in thermal conductivity than the bonding layer.

4 Claims, 1 Drawing Sheet

(56) References Cited

U.S. PATENT DOCUMENTS

| | | | | |
|---|---|---|---|---|
| 2014/0008880 A1* | 1/2014 | Miura | ................. | H01L 21/6831 |
| | | | | 279/128 |
| 2018/0040497 A1* | 2/2018 | Harayama | .............. | H02N 13/00 |
| 2019/0139805 A1* | 5/2019 | Muneishi | .......... | H01L 21/67103 |
| 2019/0313482 A1* | 10/2019 | Kamitani | ............... | H05B 3/143 |
| 2021/0143046 A1* | 5/2021 | Hamada | ................. | H02N 13/00 |

OTHER PUBLICATIONS

Thermal conductivity and dielectric properties of bismaleimide/ cyanate ester copolymer. Author: Wan et al. Source: https://ietresearch.onlinelibrary.wiley.com/doi/10.1049/hve.2017.0056#:~:text=The%20thermal%20conductivities%20of%20BMI,K)%20of%20unfilled%20BADCy%20system. Pub Date: Sep. 1, 2017 (Year: 2017).*

* cited by examiner

SAMPLE HOLDER

TECHNICAL FIELD

The present disclosure relates to a sample holder.

CROSS-REFERENCE TO RELATED APPLICATION

This application is a national stage entry according to 35 U.S.C. 371 of International Application No. PCT/JP2019/024920, filed on Jun. 24, 2019, which claims priority to Japanese Patent Application No. 2018-120971, filed on Jun. 26, 2018, the contents of which are entirely incorporated herein by reference.

BACKGROUND

One of heretofore known sample holders designed for use in a semiconductor manufacturing apparatus, etc. is disclosed in Japanese Unexamined Patent Publication JP-A 2016-103560 (hereafter referred to as Patent Literature 1). The known sample holder includes a ceramic base including an upper surface which serves as a sample holding face, a heat-generating resistor disposed on a lower surface of the ceramic base, and a metallic support joined via a joining layer to the lower surface of the ceramic base.

SUMMARY

A sample holder according to the disclosure includes: a ceramic substrate including one principal surface which serves as a sample holding face, and another principal surface; a heat-generating resistor disposed in an interior of the ceramic substrate or on the other principal surface of the ceramic substrate; a metallic member configured to cover the other principal surface of the ceramic substrate, the metallic member provided with a through hole which opens into one principal surface of the metallic member and another principal surface of the metallic member; a bonding layer configured to bond the other principal surface of the ceramic substrate to the one principal surface of the metallic member; a lead terminal inserted in the metallic member; a conduction section which is disposed inside the bonding layer and is configured to electrically connect the heat-generating resistor and the lead terminal, the conduction section including a region extending along the other principal surface of the ceramic substrate at a distance from the other principal surface of the ceramic substrate; a joining member formed of metal, the joining member configured to join the conduction section to the lead terminal; and a low-thermal-conductivity member configured to cover the joining member, the low-thermal-conductivity member being lower in thermal conductivity than the bonding layer.

DETAILED DESCRIPTION

A sample holder 10 will now be described with reference to drawings.

Figure 1:
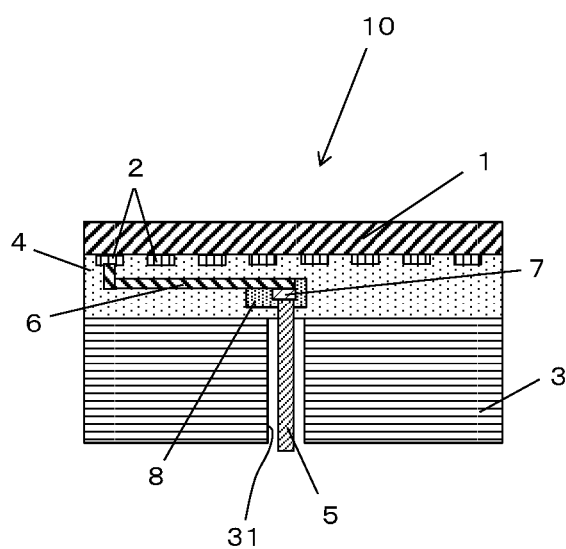
FIG. 1 is a sectional view showing an embodiment of a sample holder.

As shown in FIG. 1, the sample holder 10 includes a ceramic substrate 1 including one principal surface which serves as a sample holding face 11, and another principal surface. For example, the ceramic substrate 1 is circular in plan configuration, and is shaped in a circular plate which is substantially equal in diameter to an object to be held. One principal surface (upper surface) of the ceramic substrate 1 constitutes the sample holding face 11 for holding an object to be held. Examples of the material for the ceramic substrate 1 include oxide ceramics such as alumina, sapphire, an alumina-titania composite material, and barium titanate, and nitride ceramics such as aluminum nitride. For example, the dimensions of the ceramic substrate 1 may be set to 200 mm to 500 mm in diameter and 2 mm to 15 mm in thickness.

The sample holder 10, which holds an object to be held (sample) such as a silicon wafer, is built as an electrostatic chuck, for example. In this case, the ceramic substrate 1 includes an electrostatic attraction electrode thereinside. Examples of the material for the electrostatic-attraction electrode include platinum and tungsten. A lead wire is connected to the electrostatic-attraction electrode. The electrostatic-attraction electrode is connected via the lead wire to an electrical power source. On the other hand, an object to be held (sample), which is to be attracted to the sample holding face 11, is connected to ground. Thus, an electrostatic attractive force is generated between the electrostatic-attraction electrode and the object to be held, and it is possible to fixedly attract the object to be held (sample) to the sample holding face 11.

A heat-generating resistor 2 is disposed in the interior of the ceramic substrate 1 or on the other principal surface of the ceramic substrate 1. In the sample holder 10 having the form shown in FIG. 1, the heat-generating resistor 2 is disposed on the other principal surface (lower surface) of the ceramic substrate 1.

The heat-generating resistor 2 is a member for heating a sample held by the sample holding face 11 which is one principal surface (upper surface) of the ceramic substrate 1. The heat-generating resistor 2 is electrically connected to a lead terminal 5 via a conduction section 6 which will hereafter be described, and the heat-generating resistor 2 can generate heat by passing an electric current through the heat-generating resistor 2 via the lead terminal 5 and the conduction section 6, the heat-generating resistor 2. The heat liberated by the heat-generating resistor 2 propagates through the interior of the ceramic substrate 1, and then reaches the sample holding face 11. Thereby, it is possible to heat the sample held by the sample holding face 11.

The heat-generating resistor 2, which has a linear pattern including a plurality of turn portions, is disposed on substantially the entire area of the other principal surface (lower surface) of the ceramic substrate 1. Moreover, the heat-generating resistor 2 has a pattern configuration optimally designed for improved thermal uniformity. The heat-generating resistor 2 is dimensioned according to a resistance and the amount of power required. For example, the heat-generating resistor 2 is set to 0.1 mm to 10 mm in width, 10 μm to 5 mm in thickness, and 50 mm to 5 m in length. This arrangement reduces variations in thermal distribution on one principal surface (upper surface) of the sample holder 10.

The heat-generating resistor 2 contains a conductor component, e.g. silver, palladium, platinum, aluminum, and gold. The heat-generating resistor 2 may contain a glass component. Examples of the glass component include oxides of a material such as silicon, aluminum, bismuth, calcium, boron, and zinc. In the case where the heat-generating resistor 2 is disposed in the interior of the ceramic substrate 1, tungsten or tungsten carbide may be used as the conductor component.

The following method may be adopted for temperature control in the sample holder 10. More specifically, temperature measurement can be carried out by bringing a thermocouple into contact with the ceramic substrate 1. Moreover, the temperature of the heat-generating resistor 2 can be measured on the basis of the resistance measured by bringing a resistance temperature detector into contact with the ceramic substrate 1. By adjusting a voltage to be applied to the heat-generating resistor 2 on the basis of the temperature of the heat-generating resistor 2 thus measured, heat generation in the heat-generating resistor 2 can be controlled so that the temperature of the sample holder 10 becomes constant.

Moreover, a metallic member 3 is provided so as to cover the other principal surface of the ceramic substrate 1. The metallic member 3 is provided with a through hole 31 which opens into one principal surface of the metallic member 3 and another principal surface of the metallic member 3.

The metallic member 3 is provided to support the ceramic substrate 1. The metallic member 3 covers the other principal surface of the ceramic substrate 1 so that one principal surface (upper surface) of the metallic member 3 is opposed to the other principal surface (lower surface) of the ceramic substrate 1. More specifically, the other principal surface (lower surface) of the ceramic substrate 1 and one principal surface (upper surface) of the metallic member 3 are joined to each other via a bonding layer 4. As to the metallic member 3, the term "metallic" as used herein encompasses a ceramic-metal composite material and a composite material containing a fiber-reinforced metal, etc. In the case where the sample holder 10 is adapted for use in an environment exposed to a halogen corrosive gas or the like, aluminum (Al), copper (Cu), stainless steel, nickel (Ni), and an alloy of such metals may be used as the metal constituting the metallic member 3.

For example, the metallic member 3 is circular in plan configuration, and is shaped in a circular plate which is substantially equal in diameter to the ceramic substrate 1. For example, the metallic member 3 may be set to 10 mm to 100 mm in thickness. Moreover, the metallic member 3 is provided with the through hole 31 which opens into one principal surface (upper surface) of the metallic member 3 and the other principal surface (lower surface) of the metallic member 3, and the lead terminal 5 is provided so as to pass through the interior of the through hole 31. In other words, the lead terminal 5 is inserted into the metallic member 3. For example, the shape of the through hole 31 is such that an internal space is in the form of a cylindrical column. For example, the through hole 31 may be set to 0.1 mm to 10 mm in diameter.

The lead terminal 5 is connected at one end to the conduction section 6, and connected at the other end to an external power source. For example, an electrically conductive metal material such as nickel may be used for the lead terminal 5.

The metallic member 3 may be provided with a flow channel for circulating a heat medium such as gas or liquid. In this case, as the heat medium, it is possible to use a liquid such as water or silicone oil, or a gas such as helium (He) or nitrogen ($N_2$).

Between the other principal surface of the ceramic substrate 1 and one principal surface of the metallic member 3, there is provided the bonding layer 4 which bonds these surfaces together. In other words, the other principal surface (lower surface) of the ceramic substrate 1 and one principal surface (upper surface) of the metallic member 3 are joined to each other via the bonding layer 4.

The bonding layer 4 contains a polymeric material. Examples of the polymeric material include epoxy resin and silicone resin. The bonding layer may contain, in addition to the polymeric material, a filler blended in a dispersed state in the polymeric material. For example, ceramic particles may be used for the filler. For example, the ceramic particles may be of alumina particles or aluminum nitride particles.

For example, the bonding layer 4 may be set to 0.05 mm to 2.0 mm in thickness. The sample holder 10 may be provided with a hole formed therethrough so as to extend all the way from the upper surface of the ceramic substrate 1, through the bonding layer 4, to the lower surface of the metallic member 3.

The sample holder 10 includes the conduction section 6 disposed in the interior of the bonding layer 4. The conduction section 6 is formed of an electrically conductive metal material, e.g. copper or aluminum. The conduction section 6 electrically connects the heat-generating resistor 2 and the lead terminal 5, and is connected at one end to the heat-generating resistor 2 and connected at the other end to the lead terminal 5. The conduction section 6 includes a region extending along the other principal surface of the ceramic substrate 1 at a distance from the other principal surface. More specifically, the conduction section 6 includes a portion extending along the lower surface of the ceramic substrate 1 and a vertically extending portion. For the portion of the conduction section 6 extending along the lower surface of the ceramic substrate 1, a metallic sheet or metallic foil may be used, for example. Moreover, the vertically extending portion of the conduction section 6 electrically connects the heat-generating resistor 2 and the portion of the conduction section 6 extending along the lower surface of the ceramic substrate 1. For the vertically extending portion, a via-hole conductor or metallic foil may be used, for example.

Moreover, the sample holder 10 includes a metal-made joining member 7 which joins the conduction section 6 to the lead terminal 5.

The conduction section 6 and the lead terminal 5 are electrically connected to each other via the joining member 7. For the joining member 7, solder or brazing filler metal having a electrical conducting property may be used.

The joining member 7 is covered with a low-thermal-conductivity member 8. The low-thermal-conductivity member 8 contains a material which is lower in thermal conductivity than the bonding layer 4. For example, the low-thermal-conductivity member 8 is set to 0.01 mm to 0.1 mm in thickness.

Thus constructed, since the sample holder 10 according to the disclosure restrains heat from escaping from the joining member 7, it is possible to improve thermal uniformity in the sample holding face 11.

The thermal conductivities of the bonding layer 4 and the low-thermal-conductivity member 8 may be measured by sampling of these components, and measurement on each sample in accordance with a laser flash method (using a laser flash thermophysical property analyzer (apparatus name) LFA502 (model name) manufactured by Kyoto Electronics Manufacturing Co., Ltd. (company name)).

The low-thermal-conductivity member 8 may be formed of an insulating material. This makes it possible to increase insulation capacity in the area around the joining member 7. For example, in the case where the bonding layer 4 is predominantly composed of epoxy resin (epoxy resin accounts for the highest proportion), polyimide, fluorine resin, and graphite are used, and also, in the case where the bonding layer 4 is predominantly composed of silicone resin (silicone accounts for the highest proportion), polyimide, fluorine resin, and graphite are used.

Moreover, the low-thermal-conductivity member 8 may be formed of a material having an elastic modulus which is lower than an elastic modulus of the joining member 7. This makes it possible to relax stress on the joining member 7 by the low-thermal-conductivity member 8 and to improve durability.

Figure 2:
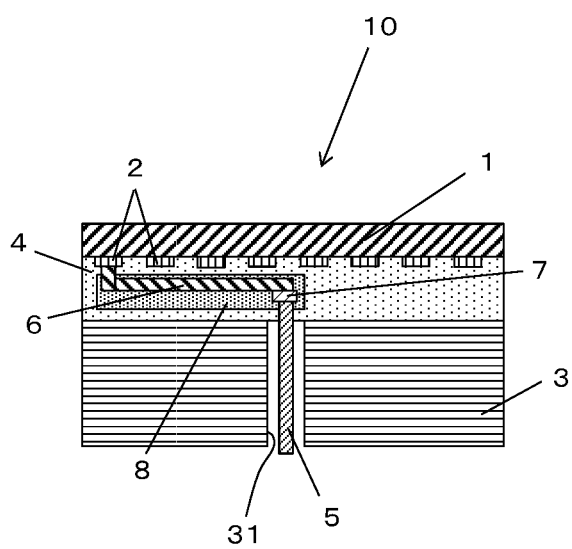
FIG. 2 is a sectional view showing another embodiment of the sample holder.

Moreover, although as shown in FIG. 1, the low-thermal-conductivity member 8 may cover part of the portion of the conduction section 6 extending along the other principal surface of the ceramic substrate 1, as shown in FIG. 2, the low-thermal-conductivity member 8 may cover at least the entire area of the region of the conduction section 6 extending along the other principal surface of the ceramic substrate 1. For example, by covering the entire area of the region of the conduction section 6 extending along the other principal surface of the ceramic substrate 1, with the low-thermal-conductivity member 8, in the case where the conduction section 6 contains metal, it is possible to suppress heat conduction due to the higher thermal conductivity than the surrounding bonding layer 4 by the low-thermal-conductivity member 8. This allows the conduction section 6 to be analogous in thermal conductivity to the surrounding bonding layer 4, and thus reduces thermal influence on the sample holding face 11, ensuring improved thermal uniformity in the sample holding face 11.

The following describes a method of manufacturing the sample holder 10. While the following description deals with the case of using alumina ceramics, even where other ceramic material such as aluminum nitride ceramics is used, the sample holder 10 can be produced in a manner similar to the following method.

As the first step, a predetermined amount of alumina powder is weighed out to prepare the principal material, and, in addition to the alumina powder, ion-exchange water, an organic solvent or organic dispersant, and balls made of metal or ceramics are put in a ball mill, and, they are wet-milled and mixed together for 24 to 72 Hrs.

Following the milling and mixing process, the resulting raw-material slurry is admixed with predetermined amounts of an organic binder such as polyvinyl alcohol, polyvinyl butyral, or acrylic resin, and auxiliary organic materials including a plasticizer and an antifoam agent, and the admixture is further subjected to a mixing process for 24 to 48 hours. The resulting organic-inorganic slurry mixture is shaped into a ceramic green sheet by means of the doctor blade method, the calender roll method, the press molding method, the extrusion molding method, or otherwise.

Then, for the formation of the electrostatic attraction electrode, for example, a platinum- or tungsten-made electrode material in paste form is formed by printing using well-known means such as the screen printing method. Moreover, three to ten ceramic green sheets are stacked one upon another into a laminate, and the laminate is perforated with a hole for receiving a via-hole conductor having a diameter of 0.1 to 0.8 mm by using a drilling machine, for example. The paste-like electrode material is buried in the hole to form a via-hole conductor. Moreover, a first conductor pattern which is 1 to 2 mm in diameter and 20 to 30 μm in thickness is formed by printing using the paste-like electrode material. In addition, a second conductor pattern which is 5 to 15 mm in diameter and 20 to 30 μm in thickness is formed on the print-formed first conductor pattern by printing using the paste-like electrode material.

A ceramic green sheet provided with the first conductor pattern and the second conductor pattern, a ceramic green sheet with the via-hole conductor buried therein, and a green sheet free from the print-formed paste-like electrode material are stacked on top of one another into a laminate. The stacking is done at a predetermined temperature under application of a pressure at a level greater than or equal to the yield stress value of the ceramic green sheet. As means for pressure application, well-known technique, e.g. uniaxial pressing method or isostatic pressing method (dry bag process or wet bag process) may be applied.

After that, the resulting laminate is fired at a predetermined temperature in a predetermined atmosphere, thereby producing the ceramic substrate 1 having a built-in electrostatic attraction electrode.

The ceramic substrate 1 is machined into a predetermined form with a predetermined thickness by using a machining center, a rotary processing machine, or a cylindrical grinding machine.

Moreover, the heat-generating resistor 2 is disposed in the interior of the ceramic substrate 1 or on the back side (the other principal surface) of the ceramic substrate 1. The heat-generating resistor 2, which is a member for heating an object to be heated, undergoes Joule heat generation upon the passage of electric current therethrough. In the case where the heat-generating resistor 2 is disposed in the interior of the ceramic substrate 1, the formation process is similar to that used to obtain the electrostatic attraction electrode. In the case where the heat-generating resistor 2 is disposed on the back side of the ceramic substrate 1, it is preferable that the heat-generating resistor 2 contains a conductor component and a glass component. Examples of the conductor component include metal materials such as a silver-palladium material, platinum, aluminum, or gold. In order to inhibit the foaming of the glass component, a metal which is sinterable in the atmosphere may be selected as the metal material. Moreover, examples of the glass component include oxides of silicon, aluminum, bismuth, calcium, boron, and zinc.

Subsequently, a recess for power feeding is provided in a back side of the ceramic substrate 1 different from the sample holding face 11 (the other principal surface) so as to uncover part of the electrostatic-attraction electrode by using a machining center or a drilling machine, for example.

The ceramic substrate 1 and the metallic member 3 formed of aluminum or the like are then joined to each other. In the case where the heat-generating resistor 2 is disposed on the back side (the other principal surface) of the ceramic substrate 1, an epoxy resin paste is applied to the back side of the ceramic substrate 1, and, after removing an excess of the resin paste with a squeegee or the like, the paste is cured. At this time, each of feeder portions located at each end of the heat-generating resistor 2 is provided with a sealer to prevent adhesion of the resin paste to the feeder portions. Subsequently, the laminate is processed by a rotary processing machine or the like with good flatness to form a first layer of the bonding layer 4.

After that, the conduction section 6 containing, for example, metallic foil such as copper foil or aluminum foil is placed on the first layer of the bonding layer 4. The conduction section 6 is connected at the vertically extending portion thereof to the heat-generating resistor 2 by solder or the like. Moreover, the conduction section 6 is routed at the portion thereof which extends along the lower surface of the ceramic substrate 1 to a location for connection with the lead terminal 5. One end of the portion of the conduction section 6 extending along the lower surface of the ceramic substrate 1 is connected to the vertically extending portion, whereas the other end of the portion of the conduction section 6 extending along the lower surface of the ceramic substrate 1 is joined to the lead terminal 5 by solder or the like. The junction of the other end and the lead terminal 5 is covered with the low-thermal-conductivity member 8 which is lower in thermal conductivity than the surrounding bonding layer, and more specifically, is covered with a highly heat-resistant member such as a polyimide-made member. It is greatly preferred that the total thermal conductivity of the low-thermal-conductivity member 8 and solder used in combination is equal to the thermal conductivity of the bonding layer 4. With the match in thermal conductivity, the bonding layer 4 and the junction become identical in respect of heat conduction from the ceramic substrate 1, ensuring improved thermal uniformity in the sample holding face 11 of the ceramic substrate 1.

Then, the ceramic substrate 1 and the metallic member 3 formed of aluminum or the like are joined to each other. A silicone paste which becomes a second layer of the bonding layer 4 is applied to the metallic member 3. After removing an excess of the silicone paste with a squeegee or the like, the ceramic substrate 1 is bonded to the metallic member 3 in a vacuum. The silicone paste is pressurized until it has a predetermined thickness, and then subjected to a curing process at 100° C. for two hours. The bonding material which becomes the bonding layer 4 may be cured in the presence of a catalyst, etc. at room temperature. At this time, the ceramic substrate 1 and the metallic member 3 are positioned in proper alignment with each other in a manner permitting insertion of the lead terminal 5 into the through hole 31 of the metallic member 3.

The sample holder according to this embodiment can be produced in the manner thus far described.

REFERENCE SIGNS LIST

1: Ceramic substrate
2: Heat-generating resistor
3: Metallic member
31: Through hole
4: Bonding layer
5: Lead terminal
6: Conduction section
7: Joining member
8: Low-thermal-conductivity member

The invention claimed is:

1. A sample holder, comprising:
a ceramic substrate comprising: a first surface configured to contact with a sample; and a second surface opposed to the first surface;
a heater coupled to the second surface;
a metallic member comprising with a through hole;
a bonding layer between the second surface and the metallic member, the bonding layer covers the heater, wherein the bonding layer is formed of silicone;
a lead terminal located in the through hole and the bonding layer;
a conduction section:
formed inside the bonding layer;
extending along the second surface at a distance from the second surface; and
electrically connecting the heater to the lead terminal;
a joining member containing a metal, the joining member connecting the conduction section to the lead terminal, wherein the joining member is located inside of the bonding layer;
a low-thermal-conductivity member that covers the joining member and is located inside of the bonding layer, the low-thermal-conductivity member being lower in thermal conductivity than the bonding layer.

2. The sample holder according to claim 1, wherein the low-thermal-conductivity member comprises an insulating material.

3. The sample holder according to claim 1, wherein the low-thermal-conductivity member comprises a material having an elastic modulus which is lower than an elastic modulus of the joining member.

4. The sample holder according to claim 1, wherein the low-thermal-conductivity member covers at least an entire area of the region of the conduction section extending along the other principal surface of the ceramic substrate.

* * * * *